US010250182B2

(12) United States Patent
Singer et al.

(10) Patent No.: US 10,250,182 B2
(45) Date of Patent: *Apr. 2, 2019

(54) MICRO-CONCENTRATOR SOLAR ARRAY USING MICRO-ELECTROMECHANICAL SYSTEMS (MEMS) BASED REFLECTORS

(71) Applicant: The Boeing Company, Chicago, IL (US)

(72) Inventors: Scott Benjamin Singer, Sherman Oaks, CA (US); Dimitri D. Krut, Encino, CA (US); Nasser H. Karam, LaCanada, CA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/532,356

(22) Filed: Nov. 4, 2014

(65) Prior Publication Data
US 2015/0244310 A1    Aug. 27, 2015

Related U.S. Application Data

(63) Continuation-in-part of application No. 14/186,703, filed on Feb. 21, 2014.

(51) Int. Cl.
*H01L 31/054* (2014.01)
*H02S 20/32* (2014.01)

(52) U.S. Cl.
CPC .......... *H02S 20/32* (2014.12); *H01L 31/0543* (2014.12); *H01L 31/0547* (2014.12); *Y02E 10/52* (2013.01)

(58) Field of Classification Search
CPC ............ G02B 26/0833; G02B 26/0841; G02B 26/085; H01L 31/054; H01L 31/0547; H02S 20/32
(Continued)

(56) References Cited

U.S. PATENT DOCUMENTS 412,724 A    10/1889 Calver
503,004 A    8/1893 Severy
(Continued)

FOREIGN PATENT DOCUMENTS

AU    2015224402 A1    5/2016
CA       2878660 A1    8/2015
(Continued)

OTHER PUBLICATIONS

"Office Action," dated Aug. 27, 2014, regarding U.S. Appl. No. 12/416,207, 13 pages.
(Continued)

Primary Examiner — Susan D Leong
Assistant Examiner — Dujuan A Horton
(74) Attorney, Agent, or Firm — Yee & Associates, P.C.

(57) ABSTRACT

A method and apparatus for focusing light onto a plurality of solar cells. The apparatus comprises a plurality of solar cells, a plurality of groups of reflectors corresponding to the plurality of solar cells, and a control module in communication with the plurality of solar cells and the plurality of groups of reflectors. The control module includes control logic for monitoring an electrical output from the plurality of solar cells and repositioning the plurality of groups of reflectors when the electrical output is below a selected threshold.

14 Claims, 12 Drawing Sheets

(58) Field of Classification Search
USPC .................................. 359/291; 136/246, 259
See application file for complete search history.

(56) References Cited

U.S. PATENT DOCUMENTS

| | | | |
|---|---|---|---|
| 629,122 | A | 7/1899 | Davis |
| 811,274 | A | 1/1906 | Carter |
| 2,846,724 | A | 8/1958 | Aylwin |
| 2,987,961 | A | 6/1961 | Cotton et al. |
| 3,466,119 | A | 9/1969 | Francia |
| 3,713,727 | A | 1/1973 | Markosian et al. |
| 3,861,379 | A | 1/1975 | Anderson, Jr. |
| 3,905,352 | A | 9/1975 | Jahn |
| 3,964,464 | A | 6/1976 | Hockman |
| 4,034,737 | A | 7/1977 | Kume |
| 4,038,971 | A | 8/1977 | Bezborodko |
| 4,044,753 | A | 8/1977 | Fletcher et al. |
| 4,046,411 | A | 9/1977 | Richard, Jr. |
| 4,106,480 | A | 8/1978 | Lyon et al. |
| 4,110,010 | A | 8/1978 | Hilton |
| 4,198,826 | A | 4/1980 | Chromie |
| 4,235,224 | A | 11/1980 | Yarwood et al. |
| 4,243,019 | A | 1/1981 | Severson |
| 4,249,514 | A | 2/1981 | Jones |
| 4,262,660 | A | 4/1981 | Ilich |
| 4,263,895 | A | 4/1981 | Colao |
| 4,318,393 | A | 3/1982 | Goldstein |
| 4,343,294 | A | 8/1982 | Daniel |
| 4,405,010 | A | 9/1983 | Schwartz |
| 4,463,749 | A | 8/1984 | Sobczak et al. |
| 4,532,916 | A | 8/1985 | Aharon |
| 4,599,995 | A | 7/1986 | Dane |
| 4,784,700 | A | 11/1988 | Stern et al. |
| 4,825,062 | A | 4/1989 | Rather et al. |
| 5,071,243 | A | 12/1991 | Bronstein |
| 5,109,349 | A | 4/1992 | Ulich et al. |
| 5,269,288 | A | 12/1993 | Stirbl et al. |
| 5,325,844 | A | 7/1994 | Rogers et al. |
| 5,862,799 | A | 1/1999 | Yogev et al. |
| 5,979,438 | A | 11/1999 | Nakamura |
| 6,028,689 | A | 2/2000 | Michalicek et al. |
| 6,091,050 | A | 7/2000 | Carr |
| 6,225,551 | B1 | 5/2001 | Lewandowski et al. |
| 6,231,197 | B1 | 5/2001 | Nakamura |
| 6,542,657 | B2 | 4/2003 | Anderson |
| 6,906,848 | B2 | 6/2005 | Aubuchon |
| 6,942,747 | B1 | 9/2005 | Wapner et al. |
| 6,984,050 | B2 | 1/2006 | Nakamura |
| 6,988,809 | B2 | 1/2006 | Rabinowitz |
| 7,133,193 | B2 | 11/2006 | Cornwell, Jr. et al. |
| 7,432,488 | B1 | 10/2008 | Hines et al. |
| 7,567,218 | B2 | 7/2009 | Whelan |
| 7,677,241 | B2 | 3/2010 | Hickerson |
| 7,777,959 | B2 | 8/2010 | Sohn et al. |
| 7,866,836 | B2 | 1/2011 | Rabinowitz |
| 7,905,227 | B2 | 3/2011 | Luconi et al. |
| 8,008,887 | B2 | 8/2011 | Lee |
| 8,071,873 | B2 | 12/2011 | Rabinowitz |
| 8,183,082 | B1 | 5/2012 | Lewis et al. |
| 8,472,105 | B2 | 6/2013 | Zhou |
| 2004/0027638 | A1 | 2/2004 | Wong et al. |
| 2005/0034751 | A1 | 2/2005 | Gross et al. |
| 2005/0157411 | A1 | 7/2005 | Rabinowitz |
| 2005/0229924 | A1 | 10/2005 | Luconi et al. |
| 2006/0038103 | A1 | 2/2006 | Helmbrecht |
| 2006/0201498 | A1 | 9/2006 | Olsson et al. |
| 2006/0231133 | A1 | 10/2006 | Fork et al. |
| 2007/0107769 | A1* | 5/2007 | Cobb ............... H01L 31/0547 136/246 |
| 2007/0146741 | A1 | 6/2007 | Hillmer et al. |
| 2007/0236773 | A1 | 10/2007 | Pan |
| 2008/0018975 | A1 | 1/2008 | Moidu et al. |
| 2008/0137172 | A1 | 6/2008 | Staker et al. |
| 2009/0188545 | A1* | 7/2009 | Rabinowitz ............... F24J 2/08 136/246 |
| 2010/0012171 | A1 | 1/2010 | Ammar |
| 2010/0192941 | A1 | 8/2010 | Stoia et al. |
| 2010/0236603 | A1* | 9/2010 | Menard ............... G02B 3/0056 136/246 |
| 2010/0326521 | A1 | 12/2010 | Rabinowitz |
| 2011/0101253 | A1 | 5/2011 | Lal et al. |
| 2012/0031465 | A1* | 2/2012 | Battistutti ............ H01L 31/048 136/246 |
| 2012/0154162 | A1 | 6/2012 | Vandevelde et al. |
| 2012/0266938 | A1 | 10/2012 | Goei et al. |
| 2013/0000696 | A1 | 1/2013 | Giri |
| 2013/0134921 | A1 | 5/2013 | Shen et al. |
| 2014/0078568 | A1 | 3/2014 | Lal et al. |
| 2014/0137924 | A1 | 5/2014 | Hollabaugh |
| 2015/0243819 | A1 | 8/2015 | Karam et al. |
| 2015/0243822 | A1 | 8/2015 | Karam et al. |
| 2015/0244316 | A1 | 8/2015 | Singer et al. |
| 2015/0256124 | A1 | 9/2015 | Singer et al. |

FOREIGN PATENT DOCUMENTS

| | | |
|---|---|---|
| DE | 29615560 U1 | 2/1997 |
| DE | 102008039692 A1 | 3/2010 |
| DE | 102009037083 A1 | 2/2011 |
| DE | 102009039499 A1 | 3/2011 |
| DE | 102011109190 A1 | 2/2013 |
| EP | 2911208 A1 | 8/2015 |
| EP | 3018822 A1 | 5/2016 |
| JP | 2015159713 A | 9/2015 |
| WO | 2008050354 A2 | 5/2008 |
| WO | WO2008115305 A2 | 9/2008 |
| WO | WO2009121174 A1 | 10/2009 |
| WO | WO2009126263 A1 | 10/2009 |
| WO | WO2010065794 A2 | 6/2010 |

OTHER PUBLICATIONS

"Office Action," dated Oct. 21, 2011, regarding U.S. Appl. No. 12/416,207, 14 pages.
"Office Action," dated May 15, 2013, regarding U.S. Appl. No. 12/416,207, 11 pages.
"Office Action," dated Dec. 20, 2013, regarding U.S. Appl. No. 12/416,207, 4 pages.
"Office Action," dated Jan. 17, 2014, regarding U.S. Appl. No. 12/416,207, 13 pages.
Legtenberg et al., "Comb-drive actuators for large displacements," IOP Publishing Ltd., Jun. 1996, pp. 320-329.
"DLP Projectors: DLP low maintenance, filter-free projectors," Texas Instruments Incorporated, copyright 2009, 4 pages.
"Mirrorcle Technologies MEMS Mirrors—Technical Overview," Mirrorcle Technologies, Inc., copyright 2009-2013, 6 pages.
Hah et al., "Low-Votage, Large-Scan Angle MEMS Analog Micromirror Arrays With Hidden Vertical Comb-Drive Actuators," Journal of Microelectromechanical Systems, vol. 13, No. 2, Apr. 2004, pp. 279-289.
Karam et al., "Micro-Concentrator Solar Array Using Micro-Electromechanical Systems (MEMS) Based Reflectors," U.S. Appl. No. 14/186,703, filed Feb. 21, 2014, 20 pages.
Final Office Action, dated Jan. 28, 2015, regarding U.S. Appl. No. 12/416,207, 11 pages.
Office Action, dated Jun. 18, 2015, regarding U.S. Appl. No. 12/416,207, 14 pages.
Extended European Search Report, dated Jun. 29, 2015, regarding Application No. EP15150912.2, 6 pages.
Office Action, dated Nov. 3, 2015, regarding U.S. Appl. No. 14/186,703, 21 pages.
Extended European Search Report, dated Jun. 29, 2016, regarding Application No. EP16153321.12, 7 pages.
Office Action, dated Jul. 15, 2016, regarding U.S. Appl. No. 14/656,303, 40 pages.
Final Office Action, dated Apr. 22, 2016, regarding U.S. Appl. No. 14/186,703, 17 pages.
Office Action, dated Aug. 25, 2016, regarding U.S. Appl. No. 14/186,703, 17 pages.

(56) References Cited

OTHER PUBLICATIONS

Final Office Action, dated Jan. 27, 2017, regarding U.S. Appl. No. 14/186,703, 19 pages.
Office Action, dated Nov. 3, 2016, regarding U.S. Appl. No. 14/534,261, 14 pages.
Office Action, dated May 25, 2017, regarding U.S. Appl. No. 14/656,259, 54 pages.
Notice of Allowance, dated Jun. 21, 2017, regarding U.S. Appl. No. 14/656,303, 14 pages.
Final Office Action, dated Dec. 20, 2016, regarding U.S. Appl. No. 14/656,303, 18 pages.
Extended European Search Report, dated Mar. 23, 2016, regarding Application No. EP15183173.2, 8 pages.
Final Office Action, dated Mar. 13, 2018, regarding U.S. Appl. No. 14/656,259, 22 pages.
Notice of Allowance, dated Jun. 29, 2018, regarding U.S. Appl. No. 14/656,259, 8 pages.
Canadian Intellectual Property Office Examination Search Report, dated Sep. 5, 2018, regarding Application No. 2,904,561, 11 pages.
European Search Report, dated Jun. 17, 2016, regarding Application No. EP16153318.7, 2 pages.

* cited by examiner

MICRO-CONCENTRATOR SOLAR ARRAY USING MICRO-ELECTROMECHANICAL SYSTEMS (MEMS) BASED REFLECTORS

CROSS-REFERENCE TO RELATED APPLICATION

This application is a continuation-in-part of prior U.S. patent application Ser. No. 14/186,703, filed Feb. 21, 2014, and entitled "Micro-Concentrator Solar Array Using Micro-Electromechanical Systems (MEMS) Based Reflectors."

BACKGROUND INFORMATION

1. Field

The disclosed system and method relate to a micro-concentrator solar array and, more particularly, to a micro-concentrator solar array using micro-electromechanical systems (MEMS) based reflectors to track light onto a solar cell.

2. Background

Electric power generation from solar or photovoltaic cells has experienced significant interest recently. Solar cells convert light energy, typically from the sun, into electrical energy. The light intensity on a solar cell may be referred to as the number of suns, where a 1-sun concentration corresponds to standard illumination at 1 kW/m2.

Widespread adoption of solar cells for power generation may require further breakthrough in both the cost and efficiency. For example, many solar power generators currently available employ flat-plate technologies, where the solar cells operate under 1-sun concentration. These types of solar power generators have relatively low solar-to-power conversion efficiencies, are relatively large and cumbersome, and tend to transform a majority of light energy into heat. Moreover, these solar power generators may result in relatively long charge times in practice. Specifically, sometimes charging equipment using the solar power generator may take many hours, even over several days. In addition to the long charge times, the position of the solar power generators needs to be adjusted periodically during the day in order to accommodate the changing position of the sun in the sky. Therefore, it would be desirable to have a method and apparatus that take into account at least some of the issues discussed above, as well as other possible issues.

SUMMARY

In one illustrative embodiment, an apparatus comprises a plurality of solar cells, a plurality of groups of reflectors corresponding to the plurality of solar cells, and a control module in communication with the plurality of solar cells and the plurality of groups of reflectors. The control module includes control logic for monitoring an electrical output from the plurality of solar cells and repositioning the plurality of groups of reflectors when the electrical output is below a selected threshold.

In another illustrative embodiment, a method for focusing light onto a plurality of solar cells is provided. An electrical output generated by the plurality of solar cells in a solar array is monitored. A determination is made as to whether the electrical output is below a selected threshold. A plurality of groups of reflectors in the solar array is repositioned in response to a determination that the electrical output is below the selected threshold using control logic in a control module.

In yet another illustrative embodiment, a solar array system comprises a set of solar arrays and a control module in communication with the set of solar arrays. Each solar array in the set of solar arrays comprises a plurality of solar cells and a plurality of groups of reflectors corresponding to the plurality of solar cells. The control module includes control logic for monitoring an electrical output from the plurality of solar cells in the each solar array in the set of solar arrays and repositioning the plurality of groups of reflectors in the each solar array in the set of solar arrays when the electrical output is below a selected threshold.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and advantages thereof, will best be understood by reference to the following detailed description of an illustrative embodiment of the present disclosure when read in conjunction with the accompanying drawings, wherein:

DETAILED DESCRIPTION

Figure 1:
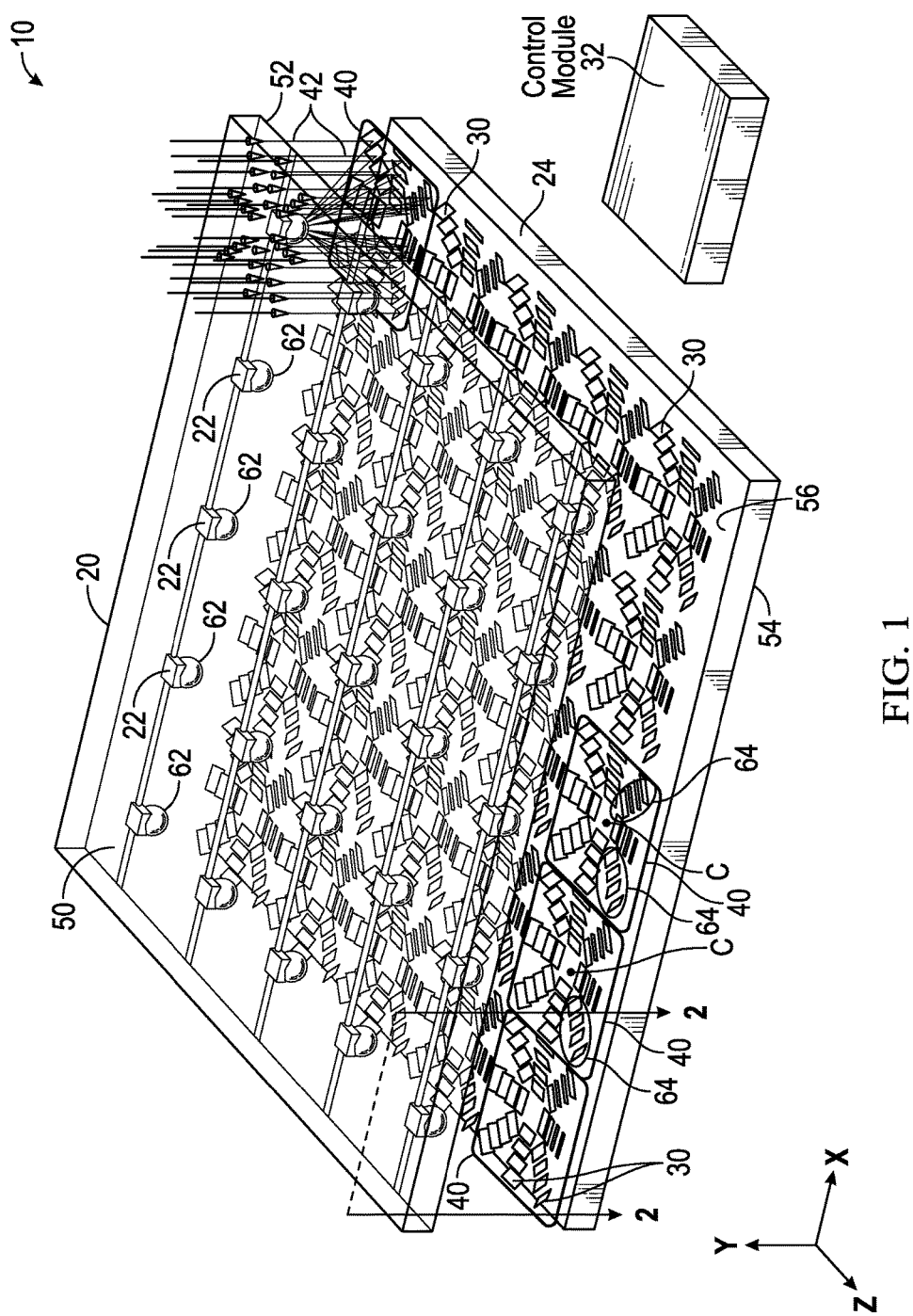
FIG. 1 is an illustration of the disclosed micro-concentrator solar array including a plurality of solar cells arranged on a coverglass and a plurality of micro-electromechanical systems (MEMS) based reflectors arranged on a substrate.

As shown in FIG. 1, the micro-concentrator solar array 10 according to an aspect of the disclosure may include a coverglass 20, a plurality of solar cells 22, a substrate 24, a plurality of micro-electromechanical systems (MEMS) based mirrors or reflectors 30, and a control module 32. In the exemplary aspect as shown, the solar cells 22 may be arranged in a 5×5 array upon the coverglass 20, which results in a total of twenty-five solar cells 22 included within the micro-concentrator solar array 10. However, those skilled in the art will appreciate that the solar array 10 may include any number of solar cells 22. An array 40 of reflectors 30 may be associated with each solar cell 22. Each reflector 30 included within the array 40 may be positioned relative to the associated solar cell 22 in order to focus or reflect a plurality of light beams 42 generated by a light source (not illustrated) onto the solar cell 22.

The light source may be any type of radiating energy source such as, for example, man-made lighting in a building, or the sun. Each reflector 30 may be selectively tiltable such that if the position of the light source changes, each reflector 30 located within the associated array 40 may be tilted accordingly in order to track the changed position of the light source relative to the associated solar cell 22. For example, if the light source is the sun, then each reflector 30 located within the associated array 40 may be tilted accordingly in order to track the changing position of the sun throughout the day. The tilting of the reflectors 30 relative to the light source is described in greater detailed below.

The micro-concentrator solar array 10 may be used in any application where light energy, typically from the sun, may be converted into electrical energy. For example, FIG. 1 illustrates a single micro-concentrator solar array 10 for purposes of convenience and clarity. The single micro-concentrator solar array 10 in FIG. 1 may be used in relatively compact applications such as, for example, a slim-line pocket-sized portable power generator. However, the single micro-concentrator solar array 10 may be electrically connected or ganged with other micro-concentrator solar arrays in order to create a two-dimensional or tiled array of multiple micro-concentrator arrays (not illustrated). The two-dimensional array of multiple micro-concentrator arrays may be used in relatively large-scale applications such as, for example, a terrestrial portable power generator, an unmanned aerial vehicle (UAV), or a satellite.

The coverglass 20 may be constructed of any transparent material that allows for the light beams 42 to pass through such as, for example, glass, plastic, or silicon dioxide. The substrate 24 may be used to support or mount the reflectors 30. In one non-limiting aspect, the substrate 24 may be constructed of fused silica.

Figure 2:
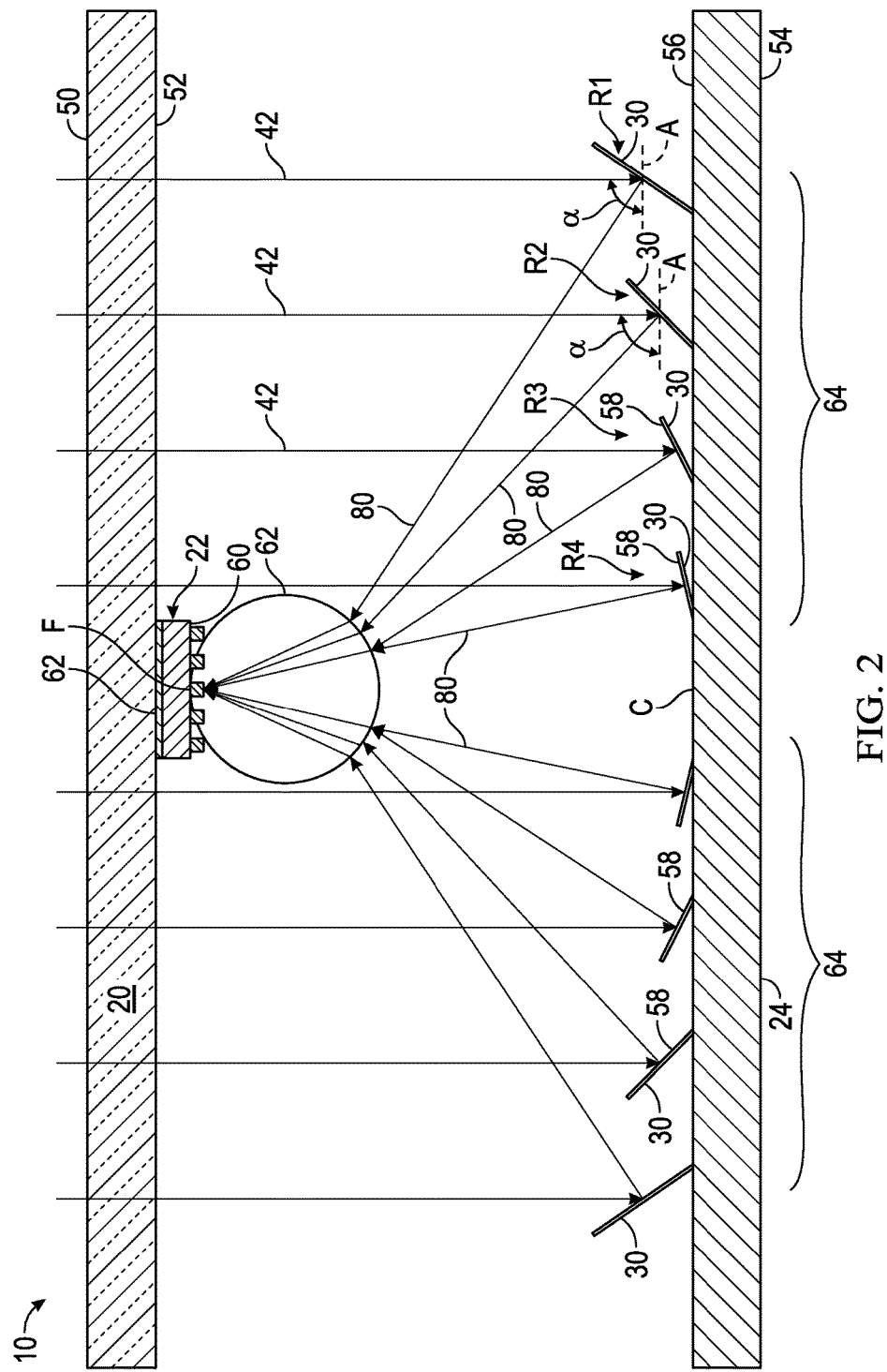
FIG. 2 is a cross-section of the micro-concentrator solar array taken along section line 2-2 in FIG. 1.

FIG. 2 is a cross-section of a portion of the coverglass 20, a single solar cell 22, the substrate 24, and the reflectors 30 associated with the single solar cell 22, taken along section line 2-2 in FIG. 1. Referring generally to FIGS. 1-2, the coverglass 20 may include an outer surface 50 and an inner surface 52, and the substrate 24 may also include an outer surface 54 and an inner surface 56. In one aspect, an optional anti-reflection coating may be applied to the inner and outer surfaces 52, 50, of the coverglass 20. The inner surface 52 of the coverglass 20 generally opposes the inner surface 56 of the substrate 24. Each solar cell 22 may include a front surface 60 and a back surface 63 (seen in FIG. 2). The back surface 63 of the solar cell 22 may be affixed to or carried by the inner surface 52 of the coverglass 20.

Although FIGS. 1-2 show the coverglass 20 located above the substrate 24, it is to be understood that this illustration is merely exemplary in nature. Those skilled in the art will appreciate that the coverglass 20 may be located relative to the substrate 24 in any position where the light beams 42 may be directed upon the reflectors 30 and onto the solar cells 22. For example, in another aspect, the micro-concentrator solar array 10 may be rotated by ninety degrees, and the coverglass 20 may be located to the right of the substrate 24. Moreover, in some aspects the coverglass 20 may be omitted. Instead, the solar cells 22 may be mounted on a corresponding support member 320 shown in FIG. 5, and is described in greater detail below.

Referring to FIG. 1, in one aspect the reflectors 30 may be arranged in a two-dimensional pattern upon the inner surface 56 of the substrate 24. Specifically, each array 40 may include multiple sub-arrays 64 of reflectors 30. In the aspect as shown in FIG. 1, each sub-array 64 may include four reflectors 30, however it is to be understood that any number of reflectors 30 may be included within the sub-array 64 as well. In the non-limiting aspect as shown in FIG. 1, each sub-array 64 of reflectors 30 may be arranged in a radially outward direction with respect to a central point C of the array 40. The specific solar cell 22 associated with the array 40 may be positioned along the inner surface 52 of the coverglass 20 to generally oppose the central point C. Although FIG. 1 illustrates each sub-array 64 of reflectors 30 arranged in a radially outward direction, those skilled in the art will appreciate that this illustration is merely exemplary in nature. For example, in another aspect, the reflectors 30 may be arranged in a rectangular pattern.

The solar cells 22 may also be referred to as photovoltaic cells. The solar cells 22 may be any device configured to convert solar radiation into electrical energy. In one exemplary aspect, the micro-concentrator solar array 10 may include a secondary optical device 62 associated with each solar cell 22. However, it is to be understood that the secondary optical device 62 may be omitted in some aspects. Referring to FIG. 2, the secondary optical device 62 may be positioned along the front surface 60 of the solar cell 22. The secondary optical device 62 may be used to focus the light beams 42 reflected off of each reflection surface 58 of the reflectors 30 and onto a focal point F located on the solar cell 22. Thus, the solar cell 22 may receive an increased amount of light energy if the secondary optical device 62 is included. The secondary optical device 62 may be any type of concentrator or lens for focusing light from the reflectors 30 onto the focal point F of the solar cell 22 such as, for example, a concave lens, a convex lens, a parabolic lens, or a Fresnel lens.

Figure 3:
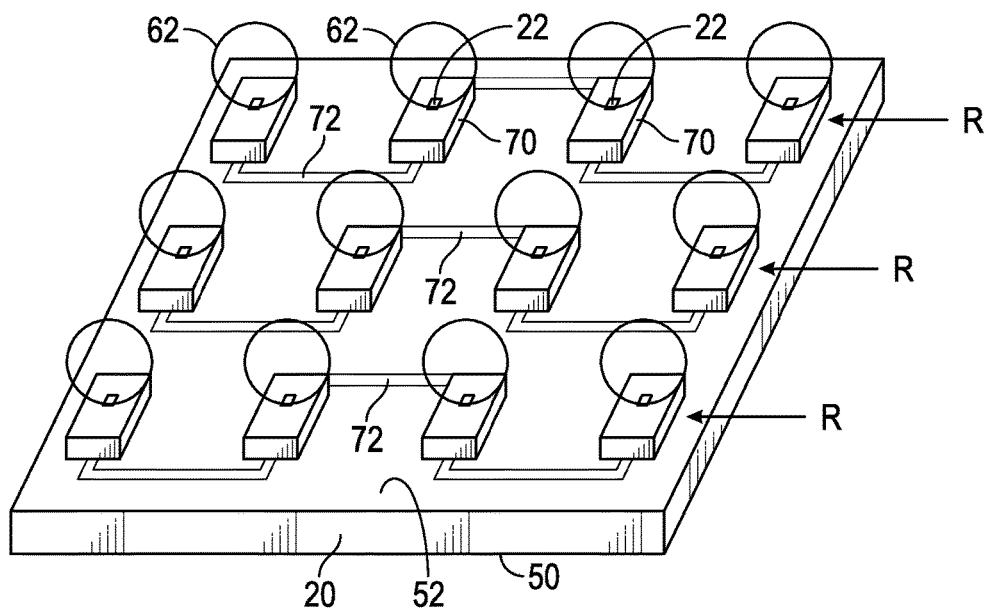
FIG. 3 is a perspective view of a portion of the coverglass shown in FIG. 1, where receivers may be used to mount the solar cells to the coverglass.

FIG. 3 illustrates a portion of the inner surface 52 of the coverglass 20, where the coverglass 20 has been rotated one hundred and eighty degrees such that the inner surface 52 of the coverglass 20 is facing upwardly. In the aspect as shown in FIG. 3, the solar cells 22 are each mounted to and electrically connected to a corresponding receiver 70. Each receiver 70 may be mounted to the inner surface 52 of the coverglass 20. The receivers 70 may be used as an alternative approach for mounting the solar cells 22 to the coverglass 20. In one aspect, the receivers 70 may include a heat sink or other device (not illustrated) for dissipating heat generated by the solar cell 22.

A plurality of interconnects 72 may be used to electrically connect two or more of the receivers 70 to one another. In one aspect, the interconnects 72 may be constructed from an electrically conductive material such as, for example, metal. The interconnects 72 may be located along the inner surface 52 of the coverglass 20, and may be used to electrically connect the receivers 70 in any number of configurations in order to provide the voltage and current required for a specific application. For example, in the aspect as shown in FIG. 3, the interconnects 72 may be used to connect the receivers 70 located in a single row 75 to one another in a series configuration. However, the interconnects 72 may also be used to connect each row 75 of receivers 70 to one another in a parallel configuration (the parallel connection is not illustrated in FIG. 3). Although FIG. 3 illustrates the receivers 70 located in each row 75 connected to one another in a series configuration, it is to be understood that the receivers 70 may be connected to one another in a parallel configuration as well. Moreover, although each row 75 of receivers 70 are described as being connected to one another in a parallel configuration, it is to be understood that the rows 75 of receivers 70 may be connected together in a series configuration as well.

Referring to FIG. 2, the reflectors 30 may be any type of MEMS-based device having an elliptical, cylindrical, rectangular, square, or randomly shaped micro-mirror or micro-reflector configured to reflect light. An actuation device (not illustrated) may be provided for each reflector 30. The actuation device may be used to adjust an amount of tilt of an associated reflector 30. Specifically, as seen in FIG. 2, the amount of tilt of each reflector may be measured by an angle $\alpha$. The angle $\alpha$ may be measured between the reflection surface 58 of the reflector 30 and an axis A-A. The axis A-A may be oriented generally parallel with respect to the substrate 24. A reflected light beam 80 may represent the light reflected off of the reflection surface 58 of the reflector 30 and directed towards the secondary optical device 62. If the secondary optical device 62 is omitted, then the reflected light beam 80 may be directed towards the focal point F located on the solar cell 22. It should be noted that while the reflector 30 is described as being tiltable or rotatable in the x-axis direction (the x-axis is illustrated in FIG. 1), the reflector 30 may be tilted about a second axis of rotation as well. Specifically, in one aspect, the angle $\alpha$ of the reflector 30 may be tilted in the z-axis direction (the z-axis is illustrated in FIG. 1) as well. Thus, the reflector 30 may be tilted using either single-axis tracking (i.e., adjusted in either the x-axis or the z-axis) or dual-axis tracking (i.e., adjusted in both the x-axis and the z-axis). In other words, the reflectors may be tiltable or rotatable about either one axis of rotation or two axes of rotation.

The actuation device (not illustrated) may be any type of device capable of adjusting the angle $\alpha$ of the associated reflector 30. For example, in one non-limiting aspect, the actuating devices may be comb-drive actuators that use static electromagnetic potential for actuation. In another aspect, the actuating devices may be a rotational actuator. One commercially available example of the rotational actuator is the 4-quadrant 2-axis actuators manufactured by Mirrorcle Technologies of Richmond, Calif.

Referring to both FIGS. 1-2, the angle $\alpha$ of the reflectors 30 may be adjusted by applying a specific or unique amount of voltage to each of the actuation devices (not illustrated). For example, with reference to FIG. 2, the reflector R1 located to the far right may be tilted at a different angle $\alpha$ when compared to the angles $\alpha$ of the remaining reflectors R2, R3 and R4 located within the sub-array 64. Each reflector 30 may be tilted at a different angle $\alpha$ based on the reflector's 30 position relative to the focal point F of the corresponding solar cell 22. Thus, a unique amount of voltage may be applied to the actuation device associated with each reflector 30 in order to tilt each reflector 30 by a specific amount.

In one approach, the control module 32 may have a voltage-tilt curve stored in memory. In one aspect, the voltage-tilt curve may be stored in memory as either a lookup table or a polynomial fit to voltage-tilt data. The voltage-tilt curve may include a plurality of unique voltage values that are each associated with different values of the angle $\alpha$ of the reflector 30. It should be noted that the voltage-tilt curve may be common to all of the reflectors 30 located within the micro-concentrator solar array 10. The memory of the control module 32 may also store the position of all of the reflectors 30 relative to the corresponding solar cell 22 as well.

The control module 32 may determine the unique amount of voltage applied to each reflector 30 using the following approach. First, the control module 32 may calculate the angle $\alpha$ of the reflectors 30. In the example as described, the control module 32 calculates the angle $\alpha$ of the reflector R1 to the far right as shown in FIG. 2. The control module 32 may calculate the angle $\alpha$ of the reflector R1 based on the position of the reflector R1 relative to the corresponding solar cell 22 (stored in memory of the control module 32), and an angle $\theta$ of the light beams 42. The angle $\theta$ of the light beams 42 may be measured with respect to the coverglass 20. The angle $\theta$ of the light beams 42 may be a known value stored in memory of the control module 32. The value of the angle $\theta$ of the light beams 42 stored in memory may be updated as the position of a light source (e.g., the sun) changes. Once the control module 32 calculates the angle $\alpha$ of the reflector R1, the control module 32 may then obtain the unique amount of voltage applied to the reflector R1 using the voltage tilt-curve. For example, if the control module 32 determines that the angle $\alpha$ of the reflector R1 should be fifteen degrees, then the control module 32 obtains the unique amount of voltage associated with an angle of fifteen degrees from the voltage-tilt curve stored in memory of the control module 32. Finally, the control module 32 may apply the unique amount of voltage obtained from the voltage-tilt curve to the actuation device associated with the reflector R1.

Referring to FIGS. 1-3, the control module 32 may refer to, or be part of, an application specific integrated circuit (ASIC), an electronic circuit, a combinational logic circuit, a field programmable gate array (FPGA), a processor (shared, dedicated, or group) that executes code, or a combination of some or all of the above, such as in a system-on-chip. The control module 32 may be in operative communication with each of the solar cells 22 and the reflectors 30. Specifically, the control module 32 may be in communication with all of the solar cells 22 located within the micro-concentrator solar array 10 through the interconnects 72 located along the coverglass 20 shown in FIG. 3 (the connection between the interconnects 72 and the control module 32 is not illustrated in the figures).

The control module 32 may include control logic for monitoring the electrical output generated by all of the solar cells 22 located within the micro-concentrator solar array 10. The electrical output measured by the control module 32 may be, for example, voltage, current, or power generated by the solar cells 22. The control module 32 may monitor the electrical output generated by all of the solar cells 22 located within the micro-concentrator solar array 10 at a predetermined time interval. The predetermined time interval may be any set amount of time such as, for example, every thirty seconds, every minute, or every five minutes.

In the illustration as shown in FIG. 2, the reflectors 30 are tilted at their ideal angles $\alpha$ such that the reflected light beams 80 are each directed towards the focal point F located on the solar cell 22. The control module 32 may store an ideal output value within memory. The ideal output value represents the electrical output of the solar cells 22 (e.g., voltage, current, power, etc.) when the reflectors 30 are tilted at their ideal angles. FIG. 2 illustrates the light source (e.g., the sun) directing the light beams 42 in a direction generally perpendicular to the coverglass 20 and the substrate 24. However, as the sun moves throughout the sky throughout the day, the direction of the light beams 42 changes accordingly. Thus, the position of the light beams 80 reflected off of the reflection surface 58 of each reflector 30 may also change. As a result, the reflected light beams 80 are eventually reflected away from the focal point F of the corresponding solar cell 22. Focusing light upon the focal point F of a corresponding solar cell 22 may maximize the amount of electrical output generated by the solar cell 22. As the reflected light beams 80 are directed away from the focal point F of the corresponding solar cell 22, less light energy may be received by the solar cell 22. As a result, the electrical output generated by the solar cell 22 is decreased.

Referring to FIGS. 1-2, the control module 32 monitors the electrical output generated by all of the solar cells 22 located within the micro-concentrator solar array 10 at the predetermined time interval. The control module 32 also includes control logic for comparing the electrical output generated by the solar cells 22 with a threshold value. The threshold value may represent an electrical output generated by all of the solar cells 22 that is less than the ideal output value. For example, in one non-limiting aspect, the threshold value may be about ninety-five percent of the ideal output value.

The control module 32 may include circuitry or control logic for applying the unique amount of voltage to each of the actuation devices (not illustrated) associated with the reflectors 30 if the electrical output generated by all of the solar cells 22 is below the threshold value. Specifically, once the electrical output generated by the solar cells 22 drops below a threshold value, then the control module 32 may apply the unique amount of voltage to each of the actuation devices (not illustrated). The reflectors 30 may be re-positioned such that the light beams 80 reflected off of the reflection surface 58 of each reflector 30 may be directed back towards the focal point F of the corresponding solar cell 22. In one aspect, the control module 32 may include control logic for re-positioning the reflectors 30 towards the focal point F of the corresponding solar cell 22 by first stepping through a plurality of pre-programmed reflector positions stored in memory. Each pre-programmed reflector position corresponds with a specific position of the light source. For example, if the light source is the sun, then each pre-programmed reflector position stored in memory of the control module 32 may correspond with the different positions of the sun in the sky. The control module 32 may step though the pre-programmed reflector positions until the reflectors 30 align and focus the light beams 80 towards the focal point F of the solar cell 22.

Figure 4:
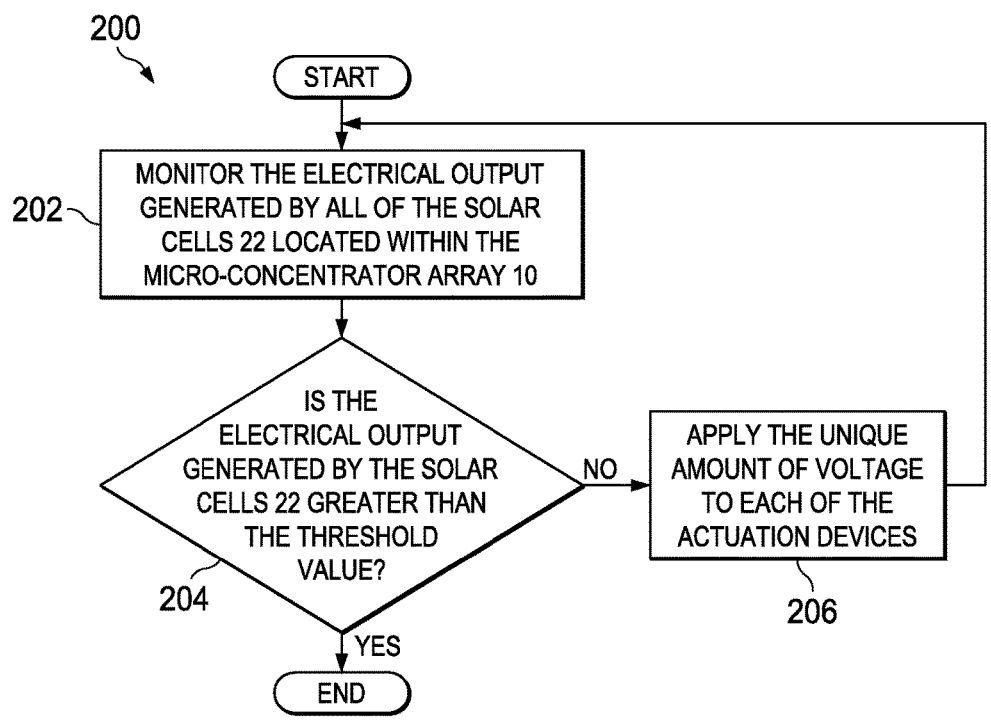
FIG. 4 is an exemplary process flow diagram illustrating a method of adjusting the reflectors shown in FIG. 1.

FIG. 4 is a process flow diagram illustrating an exemplary method 200 of adjusting the tilt of the reflectors 30. Referring generally to FIGS. 1-4, method 200 may begin at block 202, where the control module 32 monitors the electrical output generated by all of the solar cells 22 located within the micro-concentrator solar array 10. The electrical output measured by the control module 32 may be, for example, voltage, current, or power generated by the solar cells 22. Method 200 may then proceed to block 204.

In block 204, the control module 32 compares the electrical output generated by all of the solar cells 22 located within the micro-concentrator solar array 10 with the threshold value. If the electrical output is equal to or greater than the threshold value, then method 200 may then terminate. However, if the electrical output is less than the threshold value, then method 200 may proceed to block 206.

In block 206, the control module 32 may apply the unique amount of voltage to each of the actuation devices (not illustrated). As discussed above, applying the unique amount of voltage to each of the actuation devices may re-position each of the reflectors 30 such that the light beams 80 reflected off of the reflection surface 58 of each reflector 30 may be directed back towards the focal point F of the corresponding solar cell 22. Method 200 may then return to block 202.

Figure 5:
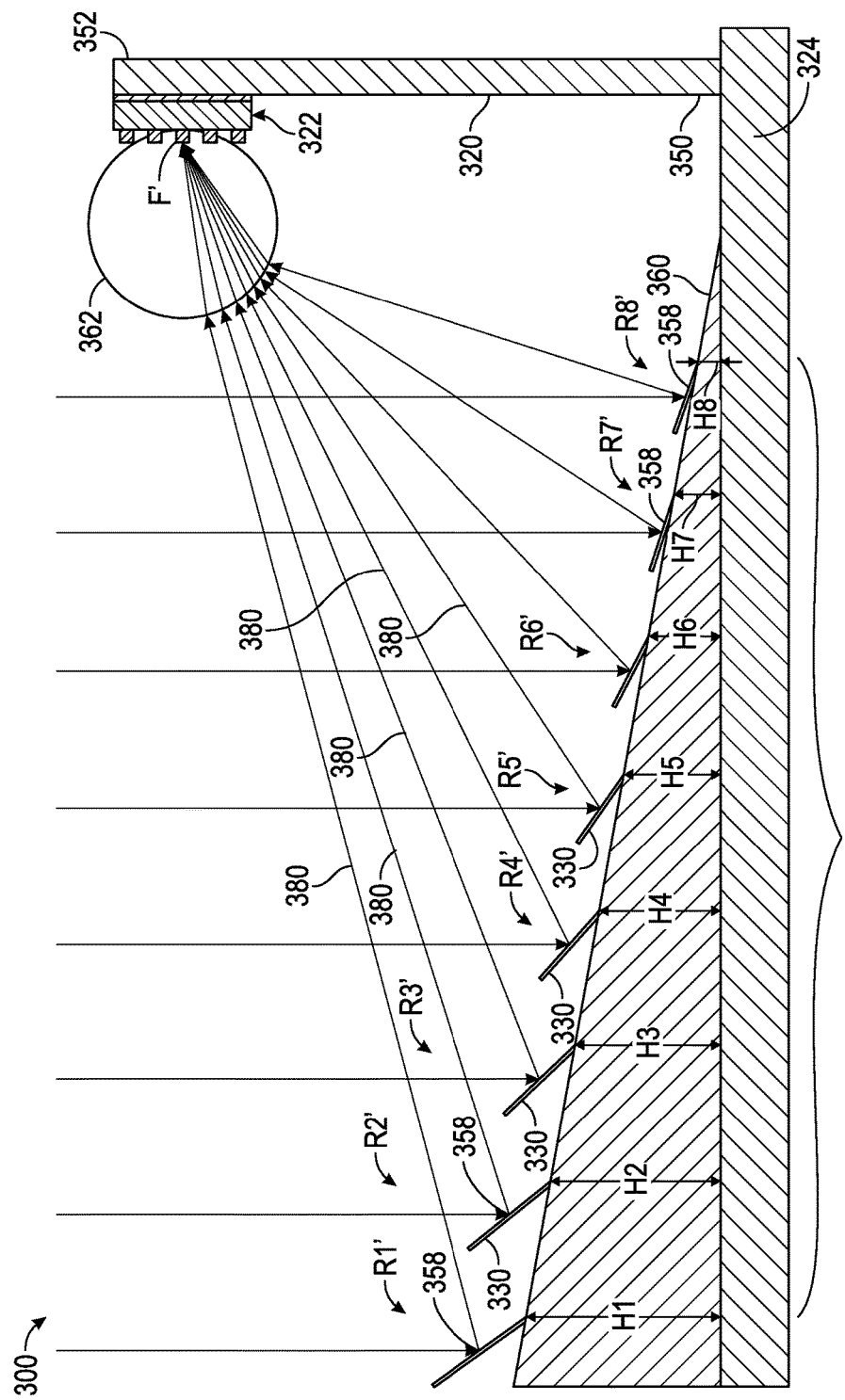
FIG. 5 is an illustration of an alternative aspect of the micro-concentrator solar array.

FIG. 5 is a cross-section of an alternative aspect of a micro-concentrator solar array 300, illustrating a single solar cell 322 and a sub-array 364 of reflectors 330 associated with the solar cell 322. In the aspect as shown in FIG. 5, the reflectors 330 may be supported by a substrate 324. A corresponding support member 320 may be attached or otherwise affixed to the substrate 324. Specifically, the support member 320 includes a first end 350 and a second end 352. The first end 350 of the support member 320 may be affixed to the substrate 324. The solar cell 322 may be affixed to the second end 352 of the support member 320. It should be noted that the aspect as shown in FIG. 5 does not require a coverglass, and instead the support member 320 may be used to carry the solar cell 322. Although FIG. 5 illustrates a single solar cell 322, those skilled in the art will appreciate that the solar cell 322 may be part of an array of multiple solar cells. For example, the substrate 324 may include multiple support members 320. Each support member 320 may carry a solar cell 322. Also, while FIG. 5 illustrates a single sub-array 364 of the reflectors 330, it is to be understood that multiple sub-arrays 364 of reflectors 330 may surround the solar cell 322.

The substrate 324 may include a ramped or inclined inner surface 360. The reflectors 330 may be positioned along the inner surface 360 of the substrate 324. In the non-limiting aspect as shown, the sub-array 364 includes eight reflectors R1'-R8', where the reflector R1' may be the reflector 330 located the furthest away from the solar cell 322, and the reflector R8' may be the reflector 330 located closest to the solar cell 322. The inner surface 360 of the substrate 324 may be angled such that the reflector R1' may be positioned at a vertical height H1, the reflector R2' may be positioned at a vertical height H2, and the remaining reflectors R3'-R8' may be positioned accordingly.

The vertical heights H1-H8 of the reflectors R1'-R8' may be graduated accordingly such that light reflected off of one of the reflectors 330 in the sub-array 364 does not generally interfere with another reflector 330 located downstream. For example, the vertical height H1 of the reflector R1' is greater than the vertical heights of the remaining reflectors R2'-R8'. Thus, the reflector R1' may be elevated such that a beam of light 380 reflected off a reflection surface 358 of the reflector R1' does not interfere or intersect with any of the remaining reflectors R2'-R8' located within the sub-array 364. Instead, the beam of light 380 reflected off the reflection surface 358 may be directed towards a secondary optical device 362 and onto a focal point F' located on the solar cell 322.

Referring generally to FIG. 1-5, the disclosed micro-concentrator solar array 10 provides a relatively compact and efficient approach for converting light into electrical energy. In particular, the disclosed micro-concentrator solar array 10 provides an approach for adjusting the MEMS based reflectors (e.g., the reflectors 30 shown in FIGS. 1-3 or the reflectors 330 shown in FIG. 5) based on the position of a moving light source (not illustrated). For example, if the light source is the sun, the reflectors may track the position of the sun throughout the sky. The reflectors may then reflect the light from the sun onto the focal point of a corresponding solar cell. Therefore, if the micro-concentrator solar array 10 is part of a solar power generator, then a user does not generally need to re-position the solar power generator periodically during the day in order to accommodate the changing position of the sun within the sky. Moreover, many solar power generators currently available employ flat-plate technologies, where the solar cells operate under 1-sun concentration. In contrast, the disclosed micro-concentrator solar array 10 uses the reflectors in order to concentrate light onto the solar cells. In one aspect, the disclosed solar cells may operate between about 5-suns to about 500-suns concentration. Thus, the disclosed micro-concentrator solar array 10 may employ smaller solar cells that require less space. The disclosed micro-concentrator array 10 may also provide higher solar-to-power conversion efficiencies, and transform less of light energy into heat when compared to the technologies currently available. While the forms of apparatus and methods herein described constitute preferred aspects of this invention, it is to be understood that the invention is not limited to these precise forms of apparatus and methods, and the changes may be made therein without departing from the scope of the invention.

The illustrative embodiments recognize and take into account that it may be desirable to have a method and apparatus for controlling a solar array to ensure that the highest concentrations of light are focused onto the solar cells of the solar array at substantially all times. In particular, it may be desirable to have a method and apparatus for ensuring that the solar cells of a solar array generate an electrical output that is at least at a selected threshold or threshold value.

Figure 6:
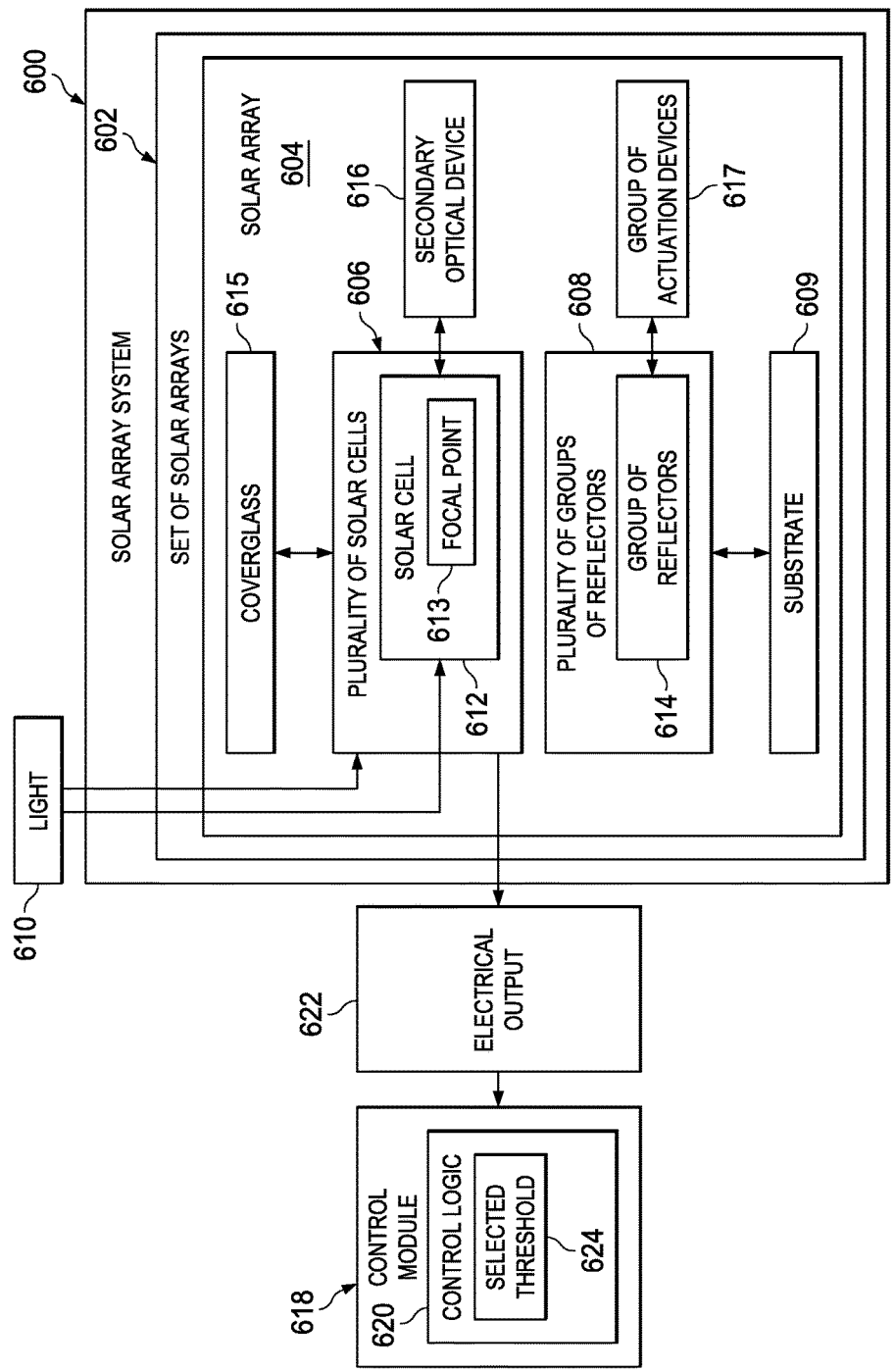
FIG. 6 is an illustration of a solar array system in the form of a block diagram in accordance with an illustrative embodiment.

Referring now to FIG. 6, an illustration of a solar array system is depicted in the form of a block diagram in accordance with an illustrative embodiment. In this illustrative example, solar array system 600 is depicted. Solar array system 600 may be comprised of set of solar arrays 602. As used herein, a "set of" items may include one or more items.

In some illustrative examples, each of set of solar arrays 602 may be referred to as a micro-concentrator solar array. In other illustrative examples, each of set of solar arrays 602 may be referred to as a solar panel. In these cases, solar array system 600 may be referred to as a solar panel system. For example, solar array 604 may be an example of one of set of solar arrays 602. Solar array 604 may be referred to as a micro-concentrator solar array. Micro-concentrator solar array 10 in FIG. 1 may be an example of one implementation for solar array 604.

As depicted, solar array 604 may be comprised of plurality of solar cells 606 and plurality of groups of reflectors 608. Plurality of groups of reflectors 608 may be supported by substrate 609. In some illustrative examples, control electronics may be integrated into substrate 609 for controlling plurality of groups of reflectors 608. These control electronics may be used to control actuation devices associated with the reflectors in plurality of groups of reflectors 608.

As used herein, when one component is "associated" with another component, the association is a physical association in the depicted examples. For example, a first component, such as an actuation device, may be considered to be associated with a second component, such as a reflector, by being secured to the second component, bonded to the second component, mounted to the second component, welded to the second component, fastened to the second component, and/or connected to the second component in some other suitable manner. The first component also may be connected to the second component using a third component. Further, the first component may be considered to be associated with the second component by being formed as part of and/or as an extension of the second component.

As used herein, the phrase "at least one of," when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required.

For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Each group of reflectors in plurality of groups of reflectors 608 may correspond to one of plurality of solar cells 606. In particular, each of the plurality of group of reflectors 608 may correspond to one of plurality of solar cells 606 by being positioned relative to the corresponding solar cell such that the group of reflectors is capable of reflecting light 610 towards the corresponding solar cell. Light 610 may take the form of, for example, without limitation, a beam of light that is comprised of a plurality of rays of light. Light 610 may be natural sunlight, artificial sunlight, or some other type of light.

For example, solar cell 612 may be an example of one of plurality of solar cells 606. Solar cell 612 may have focal point 613. Group of reflectors 614 in plurality of groups of reflectors 608 may correspond to solar cell 612. Group of reflectors 614 may include more than one reflector. Each reflector in group of reflectors may be selectively tiltable about at least one axis such that light 610 may be reflected onto focal point 613 of solar cell 612. Light 610 may pass through coverglass 615 and be reflected off group of reflectors 614 to be focused onto solar cell 612. In particular, light 610 may be focused onto focal point 613 of solar cell 612 by group of reflectors 614.

Solar cell 612 may be associated with coverglass 615. In one illustrative example, solar cell 612 may be mounted onto coverglass 615. For example, solar cell 612 may be mounted onto coverglass 615 using an interconnect that is associated with coverglass 615. Solar cell 612 may be attached to the interconnect in an inverted manner, depending on the implementation. The interconnect may be, for example, a metal interconnect. Any number of interconnects may be present on coverglass 615 for holding plurality of solar cells 606. For example, a plurality of interconnects may be used for mounting and holding plurality of solar cells 606 on coverglass 615. In some illustrative examples, bypass diodes may be integrated onto the one or more interconnects on coverglass 615.

In one illustrative example, each reflector in group of reflectors 614 and each reflector in plurality of groups of reflectors 608 may be implemented using a micro-electromechanical systems (MEMS) based reflector. Each reflector may be, for example, a micro-mirror that is tiltable about at least one axis. Group of actuation devices 617 may be associated with group of reflectors 614. Each actuation device in group of actuation devices 617 may be controlled by a voltage. This voltage may also be referred to as an actuation voltage. In some cases, the particular actuation device corresponding to a reflector may be considered part of the overall reflector. In this manner, the reflector may include the structure with the reflective material capable of reflecting light 610, the actuation device, and in some cases, one or more other components. The structure with the reflective material may be a mirror structure.

In some cases, secondary optical device 616 may be associated with solar cell 612. For example, secondary optical device 616 may be mounted onto solar cell 612 such that light 610 may be reflected from group of reflectors 614 through secondary optical device 616 to solar cell 612. Secondary optical device 62 in FIGS. 1-2 may be an example of one implementation for secondary optical device 616. In some cases, secondary optical device 616 may be considered optional.

Control module 618 may be in communication with solar array system 600. In particular, control module 618 may be in communication with each of set of solar arrays 602. For example, control module 618 may be in communication with plurality of solar cells 606 and plurality of groups of reflectors 608 of solar array 604. Control module 618 may be used to control the positioning of each reflector in set of solar arrays 602 such that light 610 may be reflected onto each of the solar cells in set of solar arrays 602.

Control module 618 may be considered part of the control electronics integrated into substrate 609 or separate from these control electronics. In some cases, control module 618 may be implemented in a manner similar to control module 32 in FIG. 1. Using control module 618, the control electronics in substrate 609, or a combination of the two, plurality of groups of reflectors 608 may be controlled to achieve high concentrations of light being reflected onto plurality of solar cells 606.

In one illustrative example, control module 618 may monitor electrical output 622 generated by plurality of solar cells 606 in solar array 604. Electrical output 622 may be in the form of voltage, current, power, or some other type of electrical output. Control module 618 may include control logic 620. Control logic 620 may be used to determine when electrical output 622 is below selected threshold 624. Selected threshold 624 may be selected based on experimentation. Selected threshold 624 may also be referred to as a threshold value.

When electrical output 622 is below selected threshold 624, control logic 620 may reposition plurality of groups of reflectors 608. Repositioning plurality of groups of reflectors 608 may include repositioning at least one reflector in plurality of groups of reflectors 608 by tilting the at least one reflector about at least one axis. This repositioning may be implemented, for example, by adjusting the voltage applied to the actuation device corresponding to the at least one reflector. Thus, control module 618 may control the repositioning of at least one reflector in plurality of groups of reflectors 608 with respect to at least one axis when electrical output 622 is below selected threshold 624.

In this manner, control module 618 having control logic 620 may be used to improve the performance of solar array 604 such that electrical output 622 produced by solar array 604 is sufficiently high. For example, as the direction in which light 610 encounters solar array 604 changes over time, any number of reflectors in plurality of groups of reflectors 608 may need to be repositioned, or tilted differently, to maintain at least selected threshold 624 of electrical output 622 from solar array 604. The direction in which light 610 encounters solar array 604 may change for a number of different reasons. For example, the location of solar array 604 relative to the source from which light 610 originates may be changed, the location of the source may change relative to the solar array 604, or some combination thereof. In one illustrative example, control module 618 may be used to control each of the plurality of groups of reflectors in each solar array in set of solar arrays 602 in a similar manner to improve the performance of each of set of solar arrays 602 in solar array system 600.

The illustration of solar array system 600 in FIG. 6 is not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

For example, in some cases, an individual control module may be associated with each of set of solar arrays 602 instead of control module 618 controlling each of set of solar arrays 602. In some illustrative examples, a portion of plurality of solar cells 606 may each be associated with a secondary optic device while another portion of plurality of solar cells 606 may not be associated with a secondary optic device.

Figure 7:
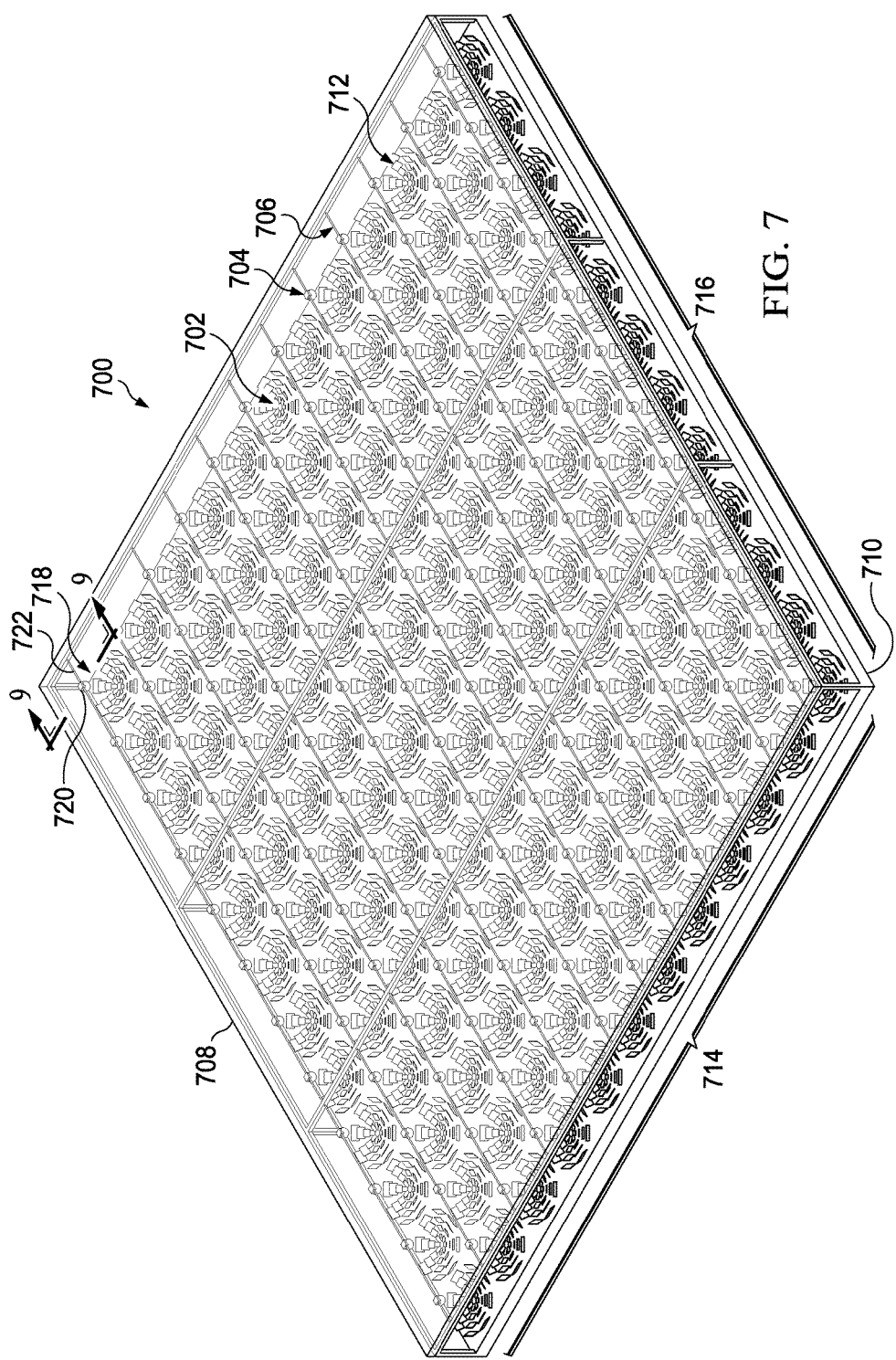
FIG. 7 is an illustration of a solar array in accordance with an illustrative embodiment.

With reference now to FIG. 7, an illustration of a solar array is depicted in accordance with an illustrative embodiment. In this illustrative example, solar array 700 may be an example of one implementation for solar array 604 in FIG. 6. As depicted, solar array 700 may include plurality of groups of reflectors 702 and plurality of solar cells 704, which may be examples of implementations for plurality of groups of reflectors 608 and plurality of solar cells 606, respectively, in FIG. 6.

As depicted, plurality of solar cells 704 are connected to plurality of interconnects 706 on coverglass 708. Plurality of secondary optical devices 712 may be mounted onto plurality of solar cells 704. In particular, each of plurality of secondary optical devices 712 may be mounted onto a corresponding one of plurality of solar cells 704.

Plurality of groups of reflectors 702 are supported by substrate 710. Plurality of groups of reflectors 702 are arranged in rows 714 and columns 716. Plurality of groups of reflectors 702 may form a 12 by 12 array in this illustrative example.

Group of reflectors 718 may be an example of one of plurality of groups of reflectors 702. Solar cell 720 may correspond to group of reflectors 718. Solar cell 720 may be connected to interconnect 722 of plurality of interconnects 706. Group of reflectors 718 may be configured to reflect a beam of light to focus the reflected beam of light onto solar cell 720.

Figure 8:
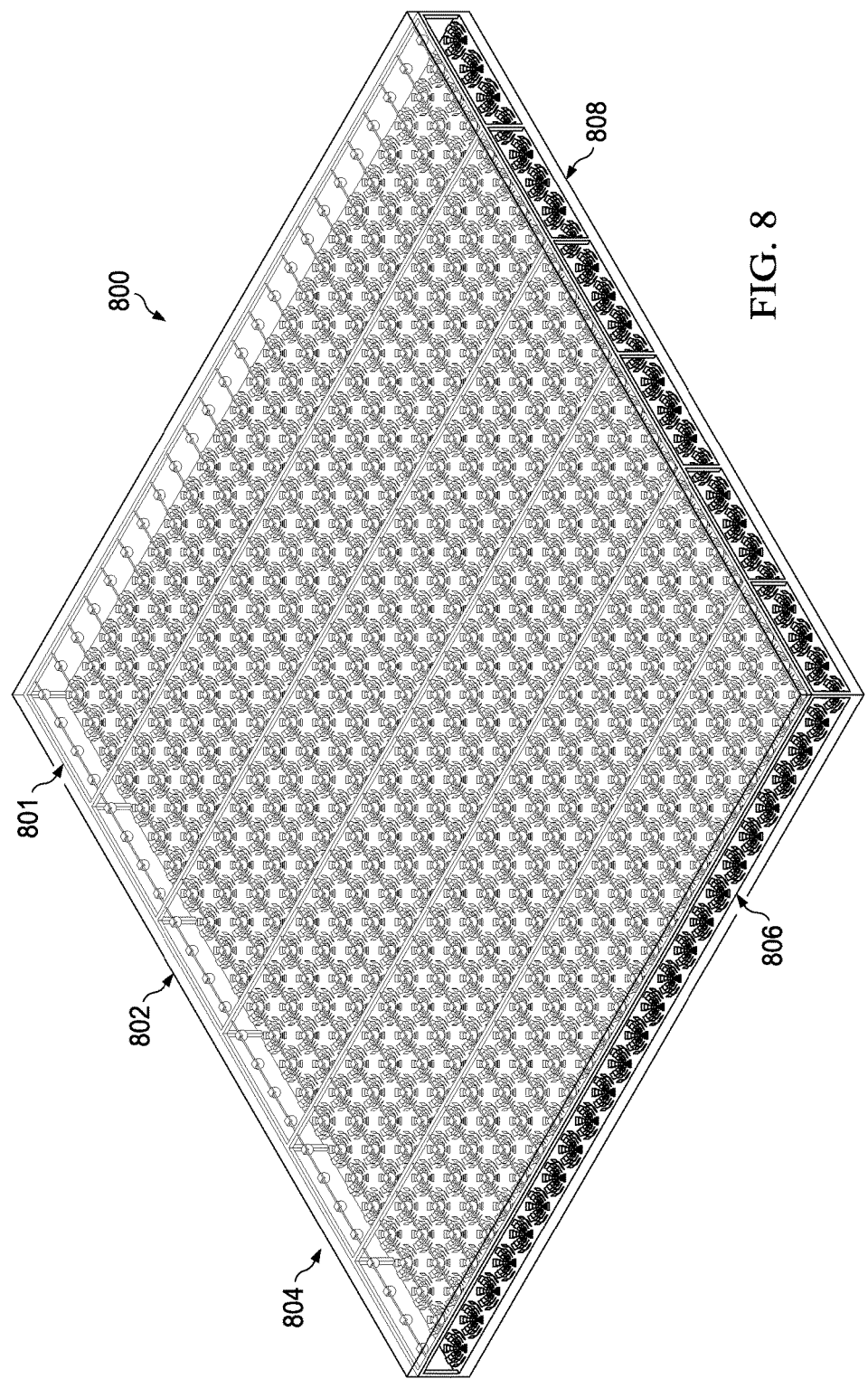
FIG. 8 is an illustration of a solar array system in accordance with an illustrative embodiment.

With reference now to FIG. 8, an illustration of a solar array system is depicted in accordance with an illustrative embodiment. In this illustrative example, solar array system 800 may be an example of one implementation for solar array system 600 in FIG. 6. Solar array system 800 may include set of solar arrays 801. Set of solar arrays 801 includes solar arrays 802, 804, 806, and 808. Each of set of solar arrays 801 may be implemented in a manner similar to solar array 700 in FIG. 7.

Figure 9:
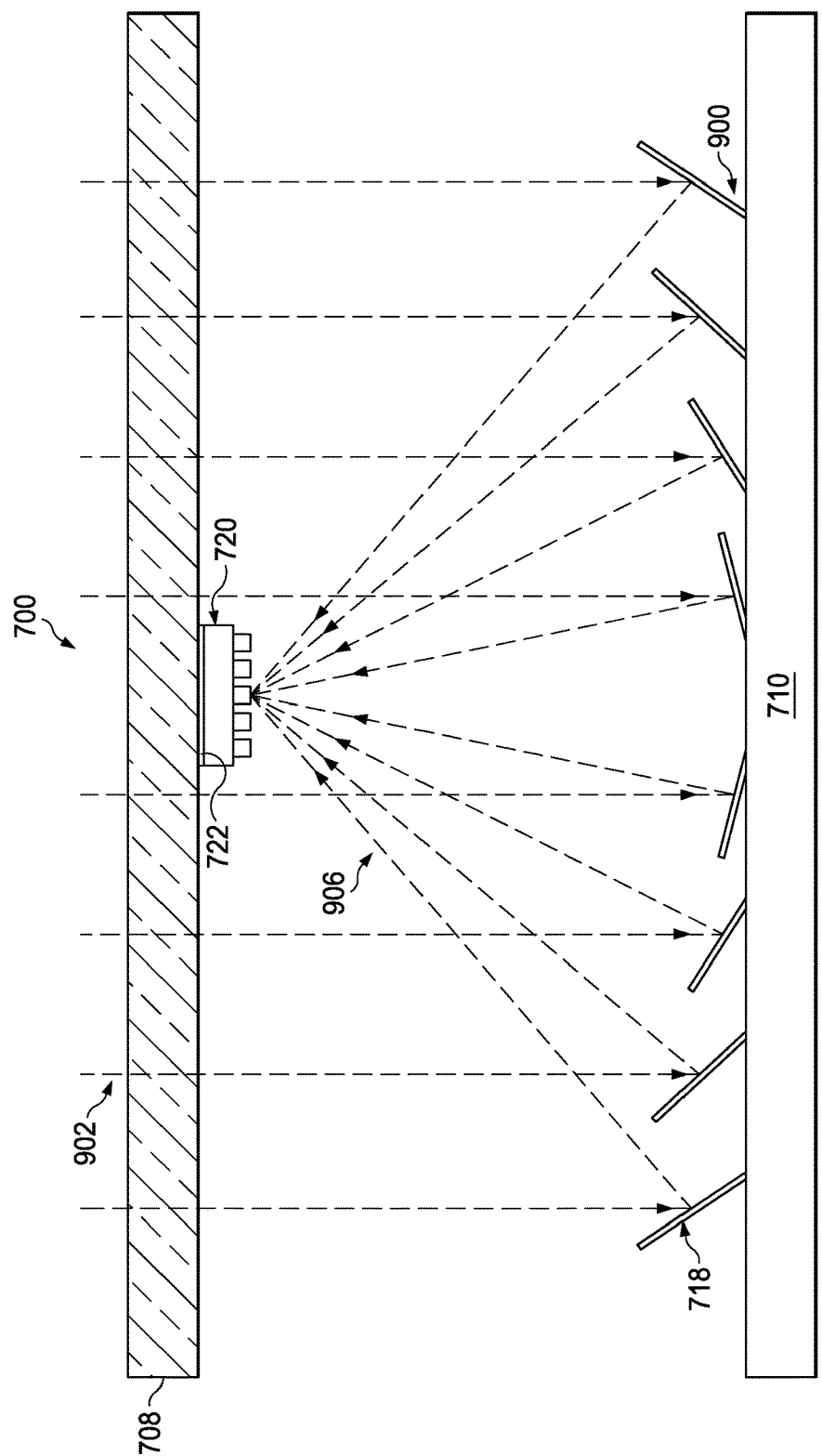
FIG. 9 is an illustration of a cross-sectional view of a solar array in accordance with an illustrative embodiment.

With reference now to FIG. 9, an illustration of a cross-sectional view of solar array 700 from FIG. 7 is depicted in accordance with an illustrative embodiment. In this illustrative example, a cross-sectional view of solar array 700 from FIG. 7 is depicted taken in the view of lines 9-9 in FIG. 7. However, in this illustrative example, the secondary optical device mounted onto solar cell 720 in FIG. 7 has been optionally excluded.

As depicted, portion 900 of group of reflectors 718 may be seen. Beam of light 902 may pass through coverglass 708 and become incident on group of reflectors 718. Beam of light 902 is reflected by group of reflectors 718 in the form of reflections 906 that are focused onto a focal point of solar cell 720. In this illustrative example, beam of light 902 may pass through coverglass 708 at an angle perpendicular to coverglass 708.

However, the angle at which beam of light 902 passes through coverglass 708 may change over time. A control module, such as control module 618 in FIG. 6, may be used to reposition one or more reflectors in group of reflectors 718 to ensure that the electrical output of solar cell 720 is kept at or above a selected threshold.

The illustrations of solar array 700 in FIGS. 7 and 9 and solar array system 800 in FIG. 8 are not meant to imply physical or architectural limitations to the manner in which an illustrative embodiment may be implemented. Other components in addition to or in place of the ones illustrated may be used. Some components may be optional.

The different components shown in FIGS. 1-4, FIG. 5, and FIGS. 7-9 may be illustrative examples of how components shown in block form in FIG. 6 can be implemented as physical structures. Additionally, some of the components in FIGS. 1-4, FIG. 5, and FIGS. 7-9 may be combined with components in FIG. 6, used with components in FIG. 6, or a combination of the two.

Figure 10:
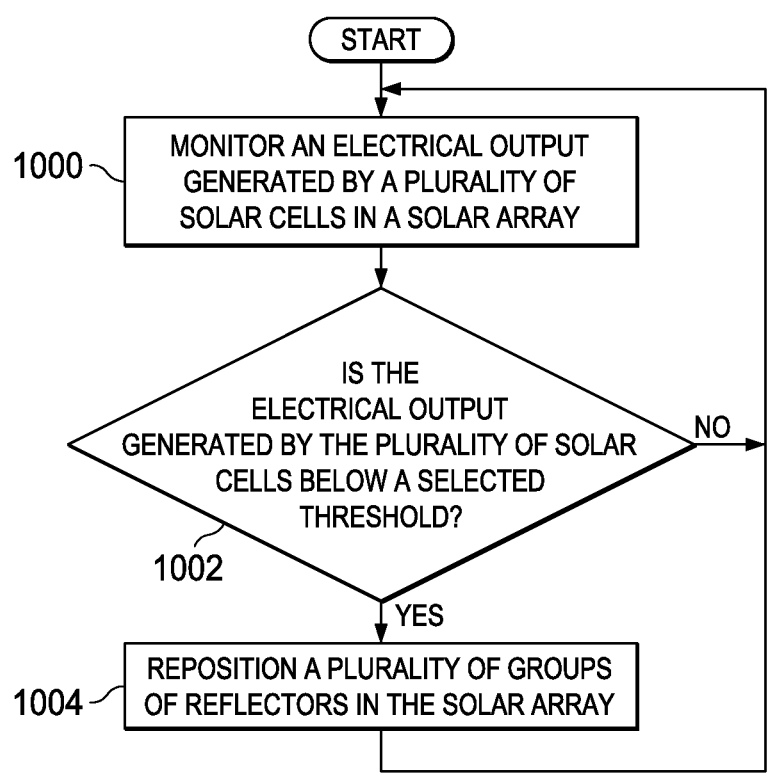
FIG. 10 is an illustration of a process for focusing light onto a plurality of solar cells in the form of a flowchart in accordance with an illustrative embodiment.

With reference now to FIG. 10, an illustration of a process for focusing light onto a plurality of solar cells is depicted in the form of a flowchart in accordance with an illustrative embodiment. The process illustrated in FIG. 10 may be used to, for example, focus a beam of light onto a plurality of solar cells, such as plurality of solar cells 606 in FIG. 6.

The process may begin by monitoring an electrical output generated by a plurality of solar cells in a solar array (operation 1000). Next, a determination may be made as to whether the electrical output generated by the plurality of solar cells is below a selected threshold (operation 1002). If the electrical output generated by the plurality of solar cells is below the selected threshold, a plurality of groups of reflectors in the solar array are repositioned (operation 1004), with the process then returning to operation 1000 as described above. Otherwise, if the electrical output generated by the plurality of solar cells is not below the selected threshold, the process returns to operation 1000 as described above.

Figure 11:
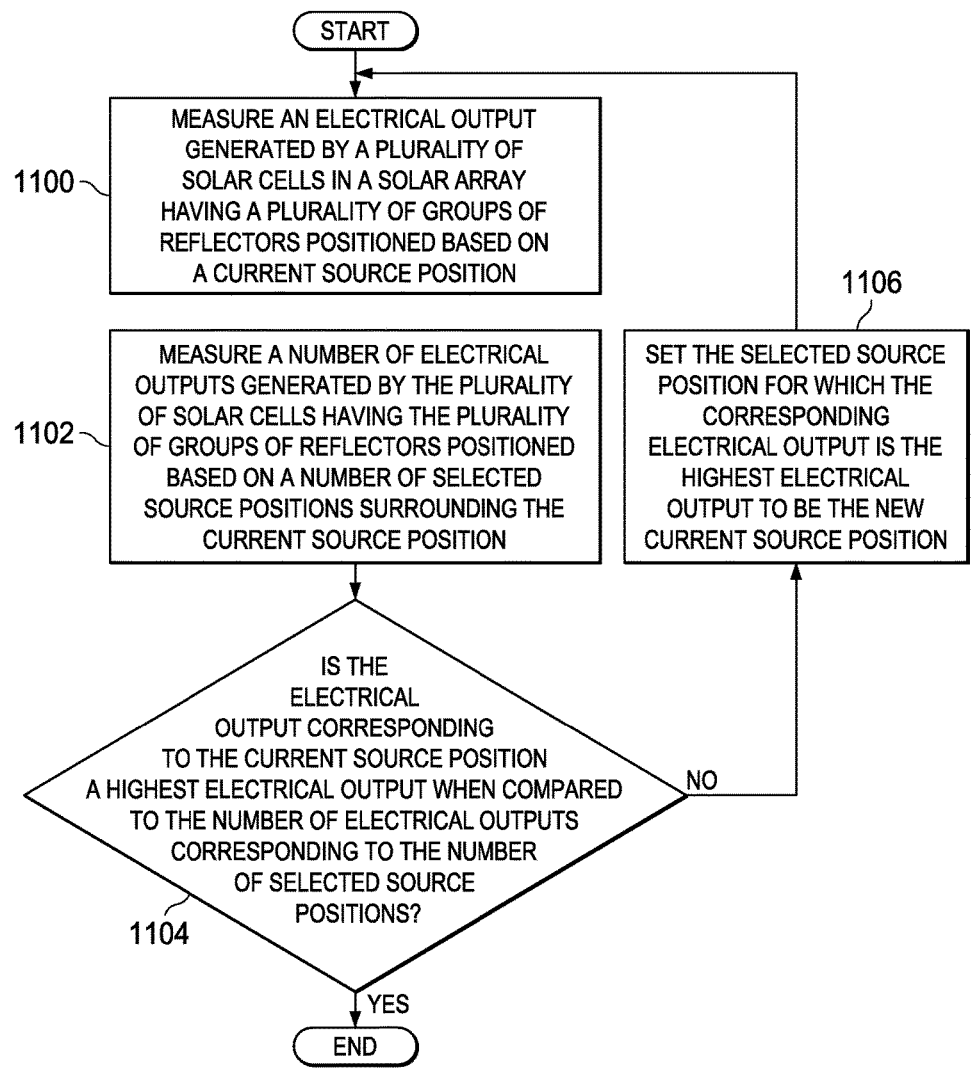
FIG. 11 is an illustration of a process for focusing light onto a solar cell in the form of a flowchart in accordance with an illustrative embodiment.

With reference now to FIG. 11, an illustration of a process for focusing light onto a solar cell is depicted in the form of a flowchart in accordance with an illustrative embodiment. The process illustrated in FIG. 11 may be used to, for example, focus a beam of light onto a plurality of solar cells, such as plurality of solar cells 606 in FIG. 6.

The process may begin by measuring an electrical output generated by a plurality of solar cells in a solar array having a plurality of groups of reflectors positioned based on a current source position (operation 1100). In operation 1100, the current source position may be defined as ($\theta_{focus}$, $\phi_{focus}$). In this manner, the current source position may be an angular position with respect to an axis that is substantially perpendicular to the solar array. Each reflector in each group of reflectors in the plurality of groups of reflectors may be positioned to reflect a beam of light being directed from this current source position to the solar cell of the plurality of solar cells corresponding to that reflector.

Next, a number of electrical outputs generated by the plurality of solar cells having the plurality of groups of reflectors positioned based on a number of selected source positions surrounding the current source position are measured (operation 1102). In operation 1102, the plurality of groups of reflectors may be repositioned based on a particular one of the number of selected source positions. The electrical output generated by the plurality of solar cells with the plurality of groups of reflectors being positioned based on this particular selected source position is measured. This process may be repeated for each of the number of selected source positions.

The number of selected source positions may include, for example, 8 positions. These 8 positions may include the following positions: ($\theta_{focus}+\Delta\theta$, $\phi_{focus}+\Delta\phi$), ($\theta_{focus}+\Delta\theta$, $\phi_{focus}-\Delta\phi$), ($\theta_{focus}-\Delta\theta$, $\phi_{focus}+\Delta\phi$), ($\theta_{focus}-\Delta\theta$, $\phi_{focus}-\Delta\phi$), ($\theta_{focus}$, $\phi_{focus}+\Delta\phi$), ($\theta_{focus}$, $\phi_{focus}-\Delta\phi$), ($\theta_{focus}+\Delta\theta$, $\phi_{focus}$), and ($\theta_{focus}-\Delta\theta$, $\phi_{focus}$). In other examples, some other number of selected source positions may be selected. For example, 4, 7, 9, 12, 20, or some other number of positions may be selected.

Thereafter, a determination is made as to whether the electrical output corresponding to the current source position is a highest electrical output when compared to the number of electrical outputs corresponding to the number of selected source positions (operation 1104). In particular, in operation 1104, the determination is made as to whether the electrical output corresponding to the current source position or the electrical output corresponding to one of the number of selected source positions is a highest electrical output.

If the electrical output corresponding to the current source position is the highest electrical output, the process terminates. Otherwise, the selected source position of the number of selected source positions for which the corresponding electrical output is the highest electrical output is set to be the new current source position (operation 1106), with the process then returning to operation 1100 as described above.

The process described in FIG. 11 may be performed repeatedly, continuously, or periodically. For example, the process described in FIG. 11 may be set to repeat at the lapse of a timer or in response to the occurrence of some event.

Figure 12:
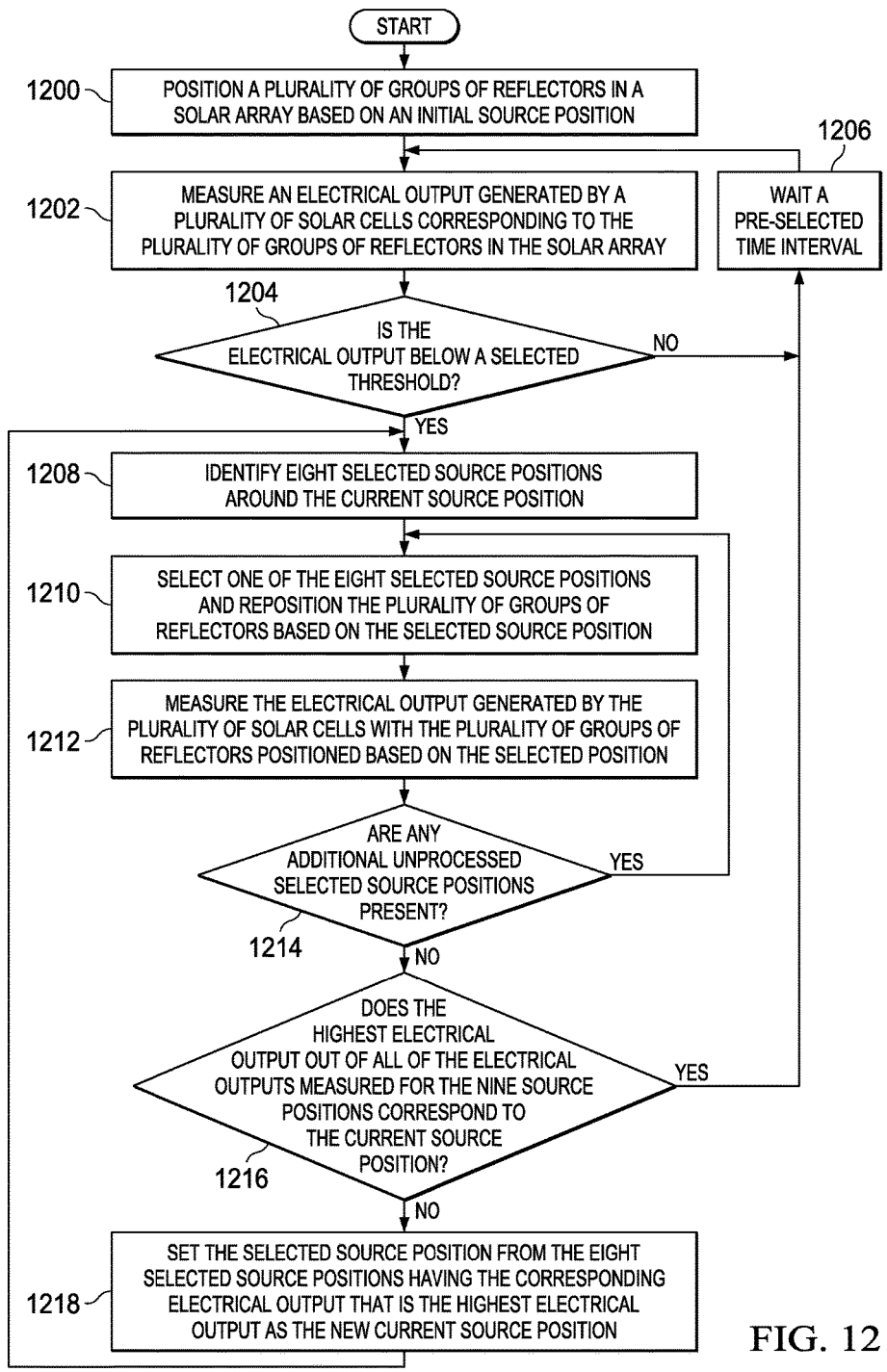
FIG. 12 is an illustration of a process for tracking sunlight using a solar array in the form of a flowchart in accordance with an illustrative embodiment.

With reference now to FIG. 12, an illustration of a process for tracking sunlight using a solar array is depicted in the form of a flowchart in accordance with an illustrative embodiment. The process illustrated in FIG. 12 may be implemented to track sunlight using, for example, solar array 604 in FIG. 6. A similar process may be used to track sunlight using a set of solar arrays, such as set of solar arrays 602 in FIG. 6.

The process may begin by positioning a plurality of groups of reflectors in a solar array based on an initial source position (operation 1200). The initial source position, ($\theta$, $\phi$) may be, for example, (0, 0). The initial source position may be the angular position relative to an axis substantially perpendicular to the solar array at which the sun is thought to be positioned. Positioning the plurality of groups of reflectors in operation 1200 may include applying a voltage to the actuation device corresponding to each reflector in the plurality of groups of reflectors such that each reflector is tilted in a manner that enables the highest concentration of light to be focused onto a corresponding solar cell in a plurality of solar cells in the solar array given the assumption that the source of the light is actually at the initial source position.

Next, an electrical output generated by the plurality of solar cells corresponding to the plurality of groups of reflectors in the solar array is measured (operation 1202). A determination is made as to whether the electrical output is below a selected threshold (operation 1204). If the electrical output is not below the selected threshold, the process waits a pre-selected time interval (operation 1206), with the process then returning to operation 1202 as described above.

With reference again to operation 1204, if the electrical output is below the selected threshold, 8 selected source positions around the current source position are identified (operation 1208). In one illustrative example, the 8 selected source positions may be 1 degree offsets from the current source position (θ, φ). For example, the 8 selected source positions may be (θ−1°, φ−1°), (θ+1°, φ−1°), (θ+1°, φ+1°), (θ+1°, φ+1°), (θ, φ−1°), (θ, φ+1°), (θ−1°, φ), and (θ+1°, φ).

Thereafter, one of the 8 selected source positions is selected and the plurality of groups of reflectors is repositioned based on the selected source position (operation 1210). Next, the electrical output generated by the plurality of solar cells is measured with the plurality of groups of reflectors positioned based on the selected source position (operation 1212). The process then determines whether any additional unprocessed selected source positions are present (operation 1214). If any additional unprocessed selected source positions are present, the process returns to operation 1210. Otherwise, the process determines whether the highest electrical output out of all the electrical outputs measured for the 9 source positions corresponds to the current source position (operation 1216). The 9 source positions include the 8 selected source positions and the current source position.

If the highest electrical output out of all of the electrical outputs measured for the 9 source positions corresponds to the current source position, the process proceeds to operation 1206 as described above. Otherwise, the selected source position from the 8 selected source positions having the corresponding electrical output that is the highest electrical output is set as the new current source position (operation 1218), with the process then returning to operation 1208 as described above.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, a portion of an operation or step, some combination thereof.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
   a coverglass having a first side facing an outside of the apparatus and a second side facing an inside of the apparatus, wherein the first and second sides are flat;
   a plurality of solar cells mounted in a first array to the coverglass on the second side;
   a substrate disposed opposite the second side of the coverglass;
   for each of the plurality of solar cells, a corresponding group of reflectors arranged on the substrate around a corresponding central point, wherein each group of reflectors comprises a plurality of reflectors arranged in a radially outward direction with respect to the central point, wherein the corresponding central point of any given group of reflectors is positioned to oppose a given corresponding solar cell of the first array, wherein together all groups of reflectors form a second array that corresponds to the first array; and
   a control module in communication with the plurality of solar cells and all groups of reflectors, wherein the control module includes control logic for:
      monitoring an electrical output generated by all of the plurality of solar cells with each reflector in each group of reflectors in the groups of reflectors positioned to reflect a beam of light directed from a current source position to the solar cell of the plurality of solar cells corresponding to the reflector,
      determining whether the electrical output generated by all of the plurality of solar cells with each reflector in each group of reflectors in the groups of reflectors positioned to reflect a beam of light directed from the current source position to the solar cell of the plurality of solar cells corresponding to the reflector is below a selected threshold,
      in response to a determination that the electrical output generated by all of the plurality of solar cells with each reflector in each group of reflectors in the groups of reflectors positioned to reflect a beam of light directed from the current source position to the solar cell of the plurality of solar cells corresponding to the reflector is below the selected threshold, identifying a plurality of selected source positions surrounding the current source position,
      positioning all of the plurality of reflectors in the groups of reflectors for each of the plurality of selected source positions surrounding the current source position such that for each of the plurality of selected source positions surrounding the current source position each reflector in each group of reflectors in the groups of reflectors is positioned to reflect a beam of light directed from the selected source position to the solar cell of the plurality of solar cells corresponding to the reflector,
      measuring the electrical output generated by all of the plurality of solar cells with the plurality of reflectors in the groups of reflectors positioned for each of the plurality of selected source positions surrounding the current source position,
      selecting the one of the plurality of selected source positions surrounding the current source position corresponding to the positions of the plurality of reflectors in the groups of reflectors for which the electrical output generated by all of the plurality of solar cells is the highest electrical output as a new current source position, and
      positioning all of the plurality of reflectors in the groups of reflectors for the new current source position such that each reflector in each group of reflectors in the groups of reflectors is positioned to reflect a beam of light directed from the new current source position to the solar cell of the plurality of solar cells corresponding to the reflector.

2. The apparatus of claim 1, wherein the control module controls repositioning of at least one reflector in the groups of reflectors with respect to at least one axis when the electrical output generated by the plurality of solar cells is below the selected threshold.

3. The apparatus of claim 1, wherein, for each of the groups of reflectors, the corresponding reflectors are arranged in rows that radiate from the corresponding central point.

4. The apparatus of claim 3, wherein the plurality of solar cells are mounted to the coverglass using a plurality of interconnects.

5. The apparatus of claim 1, wherein each reflector in the groups of reflectors is a micro-electromechanical systems based reflector.

6. The apparatus of claim 3, wherein, for each row in the rows, a given reflector in a given row is movable to a different height relative to every other reflector in the given row.

7. A method for focusing light onto a plurality of solar cells, the method comprising:
operating an apparatus, the apparatus comprising:
a coverglass having a first side facing an outside of the apparatus and a second side facing an inside of the apparatus, wherein the first and second sides are flat;
a plurality of solar cells mounted in a first array to the coverglass on the second side;
a substrate disposed opposite the second side of the coverglass;
for each of the plurality of solar cells, a corresponding group of reflectors arranged on the substrate around a corresponding central point, wherein each group of reflectors comprises a plurality of reflectors arranged in a radially outward direction with respect to the central point, wherein the corresponding central point of any given group of reflectors is positioned to oppose a given corresponding solar cell of the first array, wherein together all groups of reflectors form a second array that corresponds to the first array; and
a control module in communication with the plurality of solar cells and all groups of reflectors, wherein the control module includes control logic for monitoring an electrical output from the plurality of solar cells and repositioning ones of groups of reflectors when the electrical output is below a selected threshold;
monitoring an electrical output generated by all of the plurality of solar cells with each reflector in each group of reflectors in the groups of reflectors positioned to reflect a beam of light directed from a current source position to the solar cell of the plurality of solar cells corresponding to the reflector;
determining whether the electrical output generated by all of the plurality of solar cells with each reflector in each group of reflectors in the groups of reflectors positioned to reflect a beam of light directed from the current source position to the solar cell of the plurality of solar cells corresponding to the reflector is below a selected threshold; and
in response to a determination that the electrical output generated by all of the plurality of solar cells with each reflector in each group of reflectors in the groups of reflectors positioned to reflect a beam of light directed from the current source position to the solar cell of the plurality of solar cells corresponding to the reflector is below the selected threshold using the control logic in the control module to:
identify a plurality of selected source positions surrounding the current source position,
position all of the plurality of reflectors in the groups of reflectors for each of the plurality of selected source positions surrounding the current source position such that for each of the plurality of selected source positions surrounding the current source position each reflector in each group of reflectors in the groups of reflectors is positioned to reflect a beam of light directed from the selected source position to the solar cell of the plurality of solar cells corresponding to the reflector,
measure the electrical output generated by all of the plurality of solar cells with the plurality of reflectors in the groups of reflectors positioned for each of the plurality of selected source positions surrounding the current source position,
select the one of the plurality of selected source positions surrounding the current source position corresponding to the positions of the plurality of reflectors in the groups of reflectors for which the electrical output generated by all of the plurality of solar cells is the highest electrical output as a new current source position, and
position all of the plurality of reflectors in the groups of reflectors for the new current source position such that each reflector in each group of reflectors in the groups of reflectors is positioned to reflect a beam of light directed from the new current source position to the solar cell of the plurality of solar cells corresponding to the reflector.

8. The method of claim 7 further comprising:
determining whether the electrical output corresponding to the current source position is a highest electrical output when compared to a number of electrical outputs corresponding to the number of selected source positions.

9. The method of claim 8, wherein repositioning the groups of reflectors further comprises:
responsive to a determination that the electrical output corresponding to the current source position is not the highest electrical output, setting a selected source position of the number of selected source positions for which a corresponding electrical output is the highest electrical output to be a new current source position.

10. The method of claim 7 further comprising:
reflecting the light using the groups of reflectors to focus the light onto the plurality of solar cells.

11. The method of claim 10, wherein reflecting the light comprises:
reflecting the light using a particular group of reflectors in the groups of reflectors to focus the light onto a focal point of a corresponding solar cell of the plurality of solar cells.

12. The method of claim 7, wherein repositioning the groups of reflectors comprises:
adjusting a voltage applied to an actuation device corresponding to at least one reflector in the groups of reflectors.

13. The apparatus of claim 1 further comprising:
a plurality of secondary lenses mounted to corresponding ones of the plurality of solar cells, the plurality of secondary lenses configured to focus light on the corresponding ones of the plurality of solar cells.

14. The method of claim 7, wherein the apparatus further comprises a plurality of secondary lenses mounted to corresponding ones of the plurality of solar cells, and wherein the method further comprises:
focusing light on the corresponding ones of the plurality of solar cells using the plurality of secondary lenses.

* * * * *